(12) United States Patent
Hutzler et al.

(10) Patent No.: US 10,700,172 B2
(45) Date of Patent: Jun. 30, 2020

(54) SEMICONDUCTOR DEVICE AND METHOD FOR FABRICATING A SEMICONDUCTOR DEVICE

(71) Applicant: Infineon Technologies Austria AG, Villach (AT)

(72) Inventors: Michael Hutzler, Villach (AT); Franz Hirler, Isen (DE); Ralf Siemieniec, Villach (AT)

(73) Assignee: Infineon Technologies Austria AG, Villach (AT)

( * ) Notice: Subject to any disclaimer, the term of this patent is extended or adjusted under 35 U.S.C. 154(b) by 30 days.

(21) Appl. No.: 16/164,574

(22) Filed: Oct. 18, 2018

(65) Prior Publication Data

US 2019/0123153 A1 Apr. 25, 2019

(30) Foreign Application Priority Data

Oct. 19, 2017 (EP) .................................... 17197352

(51) Int. Cl.
*H01L 29/40* (2006.01)
*H01L 29/06* (2006.01)
(Continued)

(52) U.S. Cl.
CPC ........ *H01L 29/407* (2013.01); *H01L 29/0623* (2013.01); *H01L 29/1095* (2013.01); *H01L 29/404* (2013.01); *H01L 29/41741* (2013.01); *H01L 29/4236* (2013.01); *H01L 29/66712* (2013.01); *H01L 29/66734* (2013.01); *H01L 29/781* (2013.01); *H01L 29/7802* (2013.01);
(Continued)

(58) Field of Classification Search
CPC ............. H01L 29/0623; H01L 29/1095; H01L 29/404; H01L 29/407; H01L 29/4236; H01L 29/7802; H01L 29/7811
See application file for complete search history.

(56) References Cited

U.S. PATENT DOCUMENTS 5,981,996 A 11/1999 Fujishima
2004/0014451 A1* 1/2004 Sapp .................. H01L 29/0634
455/335

(Continued)

FOREIGN PATENT DOCUMENTS

EP 1160874 A2 12/2001
EP 1396030 A2 3/2004
(Continued)

*Primary Examiner* — David C Spalla
(74) *Attorney, Agent, or Firm* — Murphy, Bilak & Homiller, PLLC

(57) ABSTRACT

In an embodiment, a semiconductor device is provided that includes a semiconductor body having a first conductivity type, a first major surface and a second major surface opposite the first major surface, a gate arranged on the first major surface, a body region having a second conductivity type opposite the first conductivity type, the body region extending into the semiconductor body from the first major surface, a source region having the first conductivity type, the source region being arranged in the body region, a buried channel shielding region having the second conductivity type, a contact region having the second conductivity type, and a field plate arranged in a trench extending into the semiconductor body from the first major surface.

16 Claims, 12 Drawing Sheets

(51) Int. Cl.
*H01L 29/417* (2006.01)
*H01L 29/423* (2006.01)
*H01L 29/66* (2006.01)
*H01L 29/78* (2006.01)
*H01L 29/10* (2006.01)

(52) U.S. Cl.
CPC ...... *H01L 29/7811* (2013.01); *H01L 29/7813* (2013.01); *H01L 29/41766* (2013.01)

(56) References Cited

U.S. PATENT DOCUMENTS

| | | |
|---|---|---|
| 2005/0098846 A1 | 5/2005 | Nagaoka |
| 2016/0163804 A1 | 6/2016 | Kocon et al. |
| 2016/0300913 A1* | 10/2016 | Siemieniec ......... H01L 29/7803 |

FOREIGN PATENT DOCUMENTS

| | | |
|---|---|---|
| EP | 1814162 A1 | 8/2007 |
| WO | 02084745 A2 | 10/2002 |

* cited by examiner

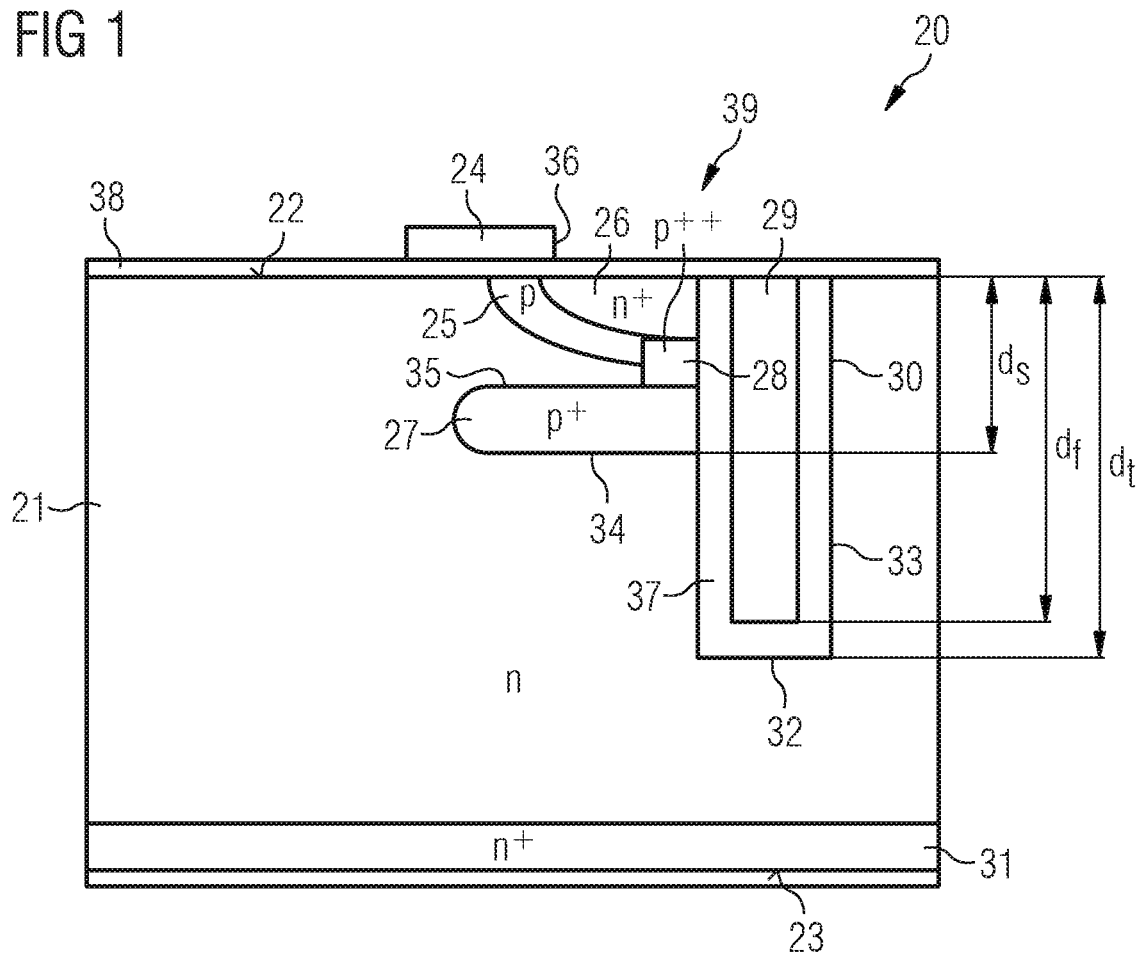

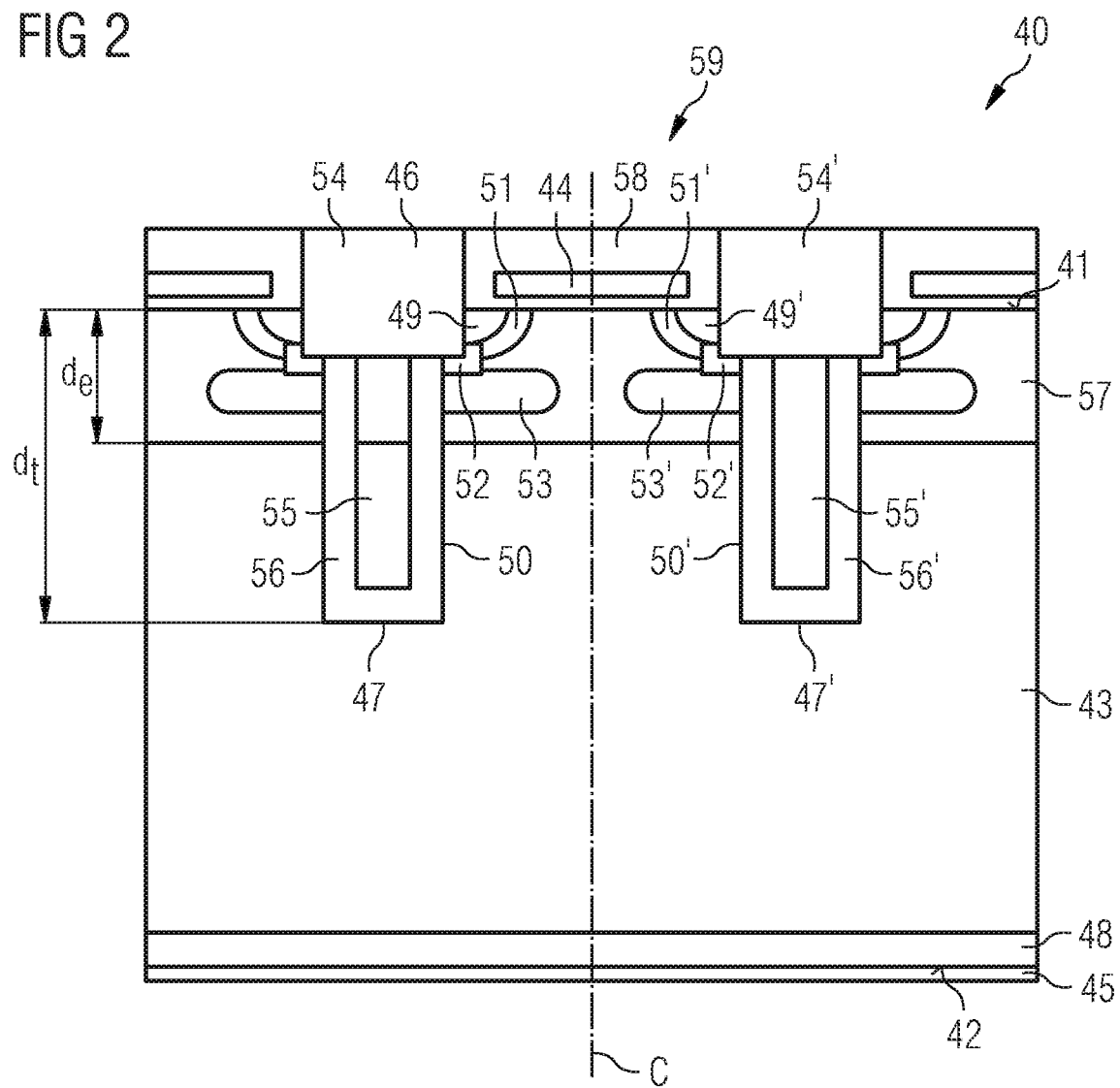

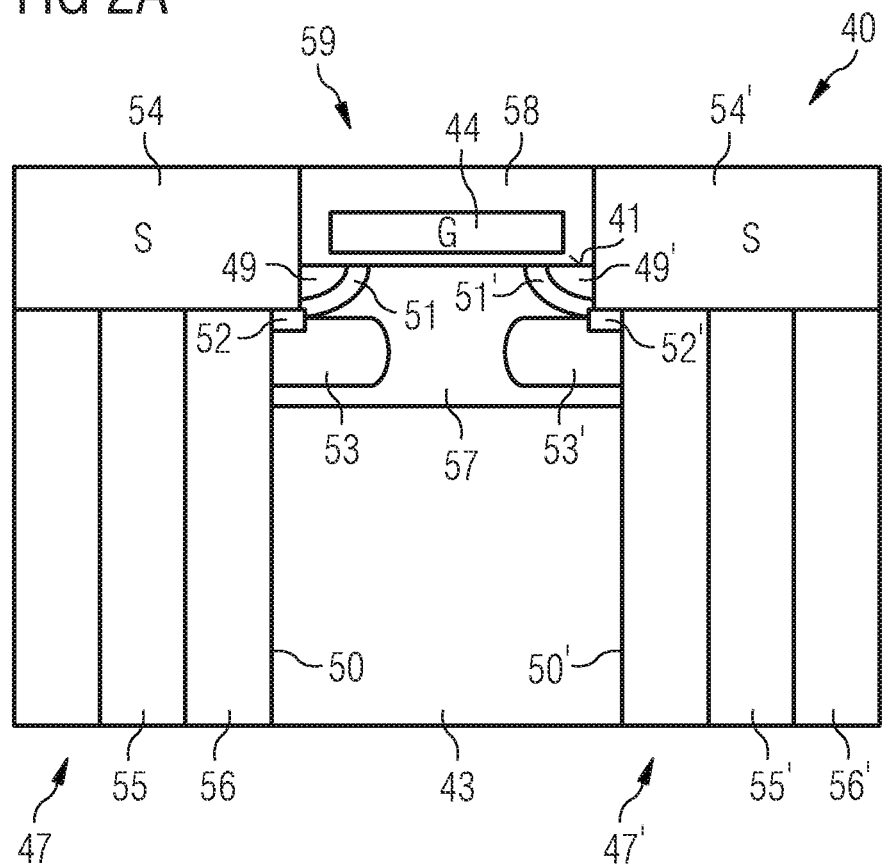
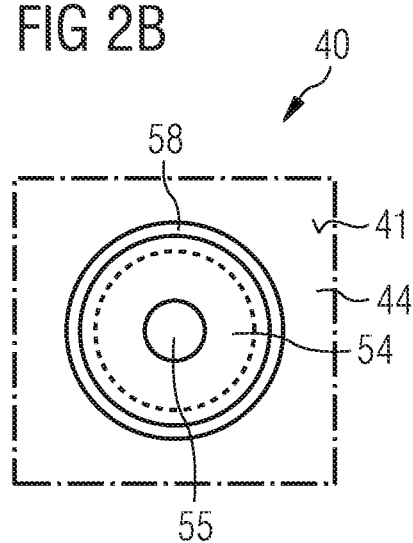

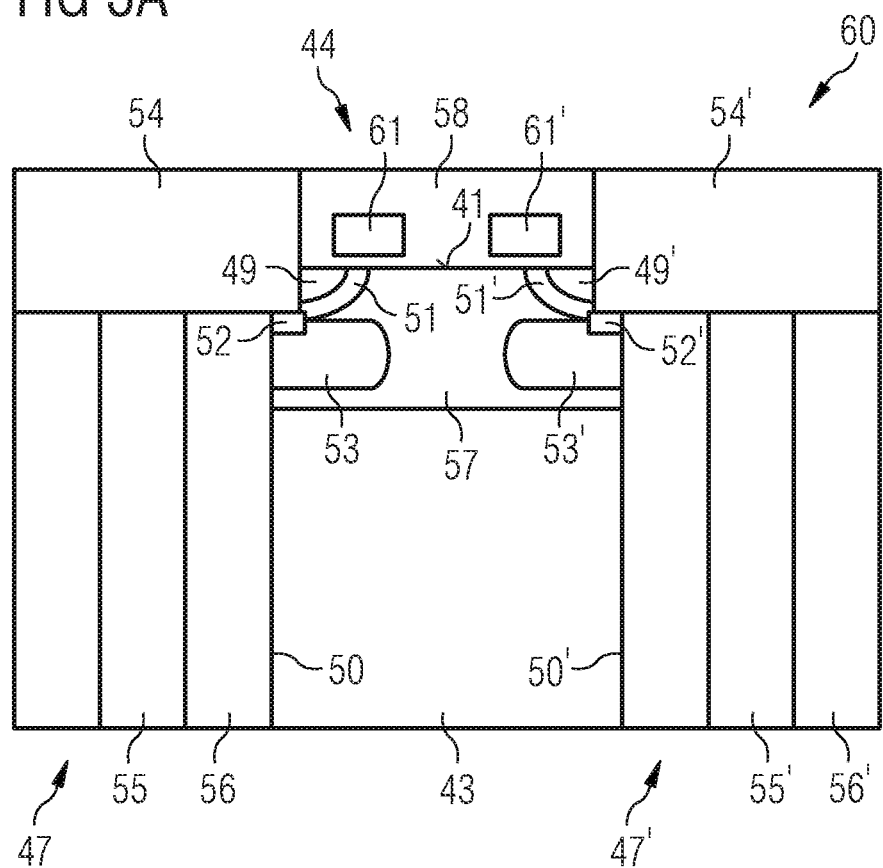
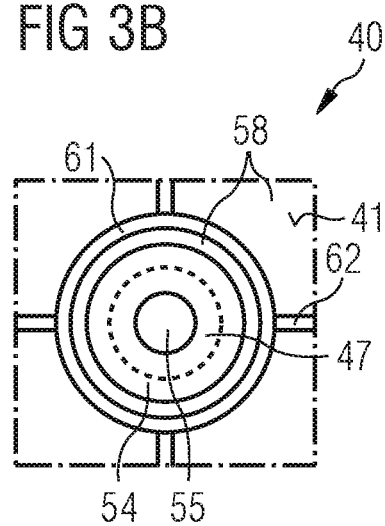

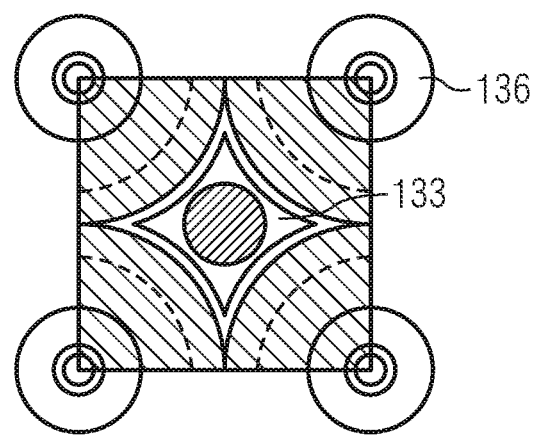
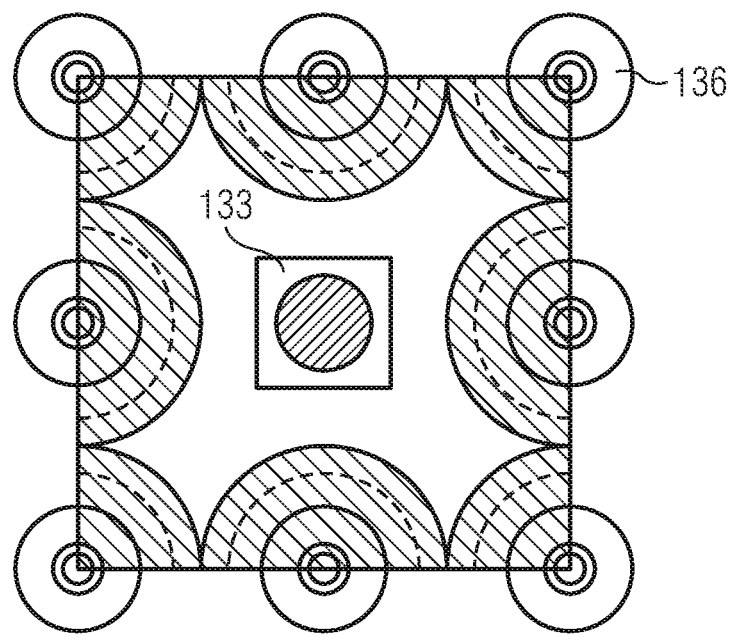

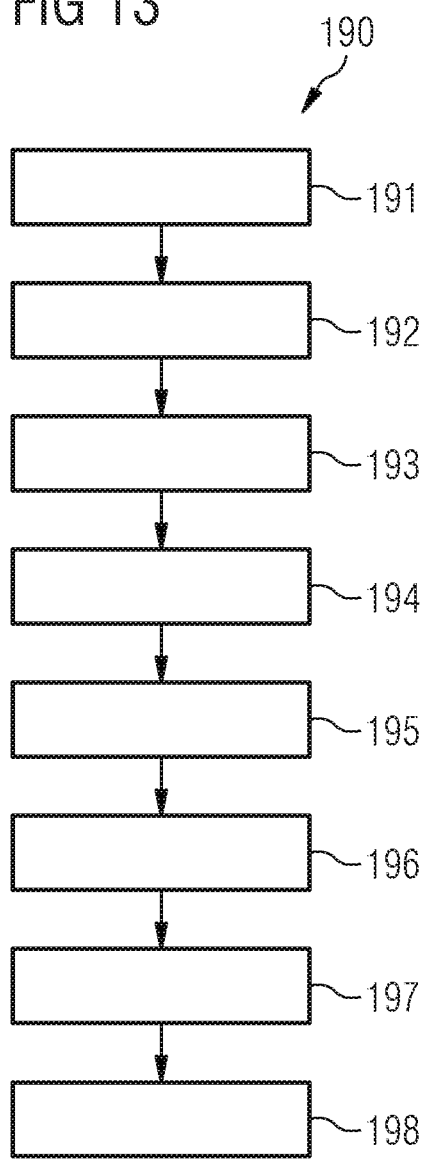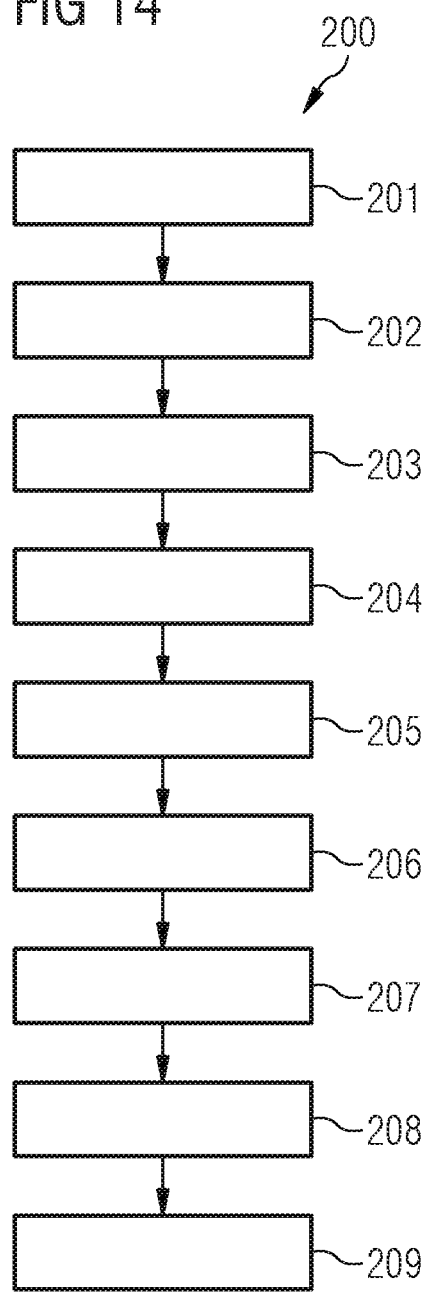

SEMICONDUCTOR DEVICE AND METHOD FOR FABRICATING A SEMICONDUCTOR DEVICE

BACKGROUND

Semiconductor devices, such as transistor devices, may be used for various applications, such as switches in power supplies and power converters. Examples of transistor devices include a Metal Oxide Semiconductor Field Effect Transistor (MOSFET) and an Insulated Gate Bipolar Transistor (IGBT). It is desirable that the semiconductor devices, in particular transistor devices, have a good and reliable performance. The performance of power MOSFETs is influenced by static and dynamic losses among other factors. Static losses occur due to various contributors to on resistance (RDSon), drain source leakage current (IDSS), gate source leakage current (IGSS) and forward voltage. Dynamic losses occur mainly due to input and output capacitance and gate resistance.

Some MOSFET devices include a compensation structure to reduce the on-state resistance of the semiconductor device and improve performance. The compensation structure may include a vertical field plate arranged within a trench extending into the semiconductor body of the transistor device. The transistor device may include a vertical gate, which may be arranged in the trench above and isolated from the vertical field plate or in a trench that is separate from the trench including the field plate, or the transistor device may include a planar or lateral gate which extends substantially perpendicularly to the vertical field plate.

Transistor structures, which enable reliable performance of the transistor device, are desirable.

SUMMARY

In an embodiment, a semiconductor device is provided that comprises a semiconductor body comprising a first conductivity type, a first major surface and a second major surface opposite the first major surface, a gate arranged on the first major surface, a body region comprising a second conductivity type, the second conductivity type opposite the first conductivity type, the body region extending into the semiconductor body from the first major surface, a source region comprising the first conductivity type, the source region being arranged in the body region, a buried channel shielding region comprising the second conductivity type, a contact region comprising the second conductivity type and a field plate arranged in a trench extending into the semiconductor body from the first major surface.

In some embodiments, the contact region couples the buried channel shielding region with the source region. The contact region may be more highly doped than the buried channel shielding region and the buried channel shielding region may be more highly doped than the body region. The semiconductor device may further include a drain region doped with the first conductivity type that is arranged below the field plate.

The semiconductor device may include a transistor structure comprising the source region, the body region, the buried channel shielding region, the contact region and the drain region and a compensation structure. The field plate may provide a compensation structure for the transistor structure. The gate may be considered to be a planar or lateral gate as it is arranged on the first major surface of the semiconductor body. The planar or lateral gate may extend substantially perpendicularly to a side wall defining the trench and substantially perpendicularly to the height of the field plate.

In some embodiments, the body region extends laterally from the trench and has a distal end positioned under the planar gate, the buried channel shielding region extends laterally from the trench and is positioned under at least a portion of the body region, and the contact region extends to or into the buried channel shielding region.

In some embodiments, the semiconductor substrate further comprises an enhancement region extending from the first major surface to the buried channel shielding region. The enhancement region comprises the first conductivity type and may be more highly doped than the semiconductor body.

In some embodiments, the source region, the body region, the contact region and the buried channel shielding region are arranged on two opposite edges of the planar gate and provide two channels that are symmetric with respect to the planar gate.

In some embodiments, the planar gate comprises a ring that is arranged on the first major surface concentrically with the field plate. In this context, a ring is not limited to a circular shape in plan view, but denotes a continuous closed shape having a width. For example, the ring may have a square, rectangular, hexagonal or irregular shape in plan view.

In some embodiments, the source region, the body region, the contact region and the buried channel shielding region are arranged adjacent a single edge of the planar gate. This arrangement may be considered as an asymmetric structure.

In some embodiments, the trench has an elongate form, for example a strip-like form. In some embodiments, the trench is columnar.

In some embodiments in which the trench is columnar, the semiconductor device further comprises a further columnar trench comprising a further field plate. Side walls of the further trench are formed by portions of the semiconductor substrate comprising the first conductivity type.

In some embodiments, the field plate is coupled to the source region, the body region, the contact region and the buried channel shielding region. The field plate may be coupled to the source region, the body region, the contact region and the buried channel shielding region by a metal contact that is in direct contact with the source region and the contact region. In some embodiments, the metal contact extends laterally asymmetrically from the field plate and leaves part of the trench in which the field plate is positioned uncovered. In other embodiments, the metal contact extends laterally symmetrically from the field plate and may cover the lateral area of the trench entirely.

The further field plate in the further columnar trench may be coupled to a further metal contact. This further metal contact may extend laterally asymmetrically from the further field plate and leave part of the further columnar trench uncovered. The further field plate in the further columnar trench may be coupled to source potential or gate potential.

In some embodiments, the buried channel shielding region is arranged within the body region. In other embodiments, the buried channel shielding region forms a pn junction with the semiconductor body.

In some embodiments, the semiconductor device further comprises a well comprising the first conductivity type arranged in the first major surface, wherein the well is arranged adjacent the second columnar trench. The well may be arranged on the opposite side of the gate to the source region.

In some embodiments, the semiconductor device further comprises a further or second buried channel shielding region. The second buried channel shielding region may extend from the buried channel shielding region towards the second major surface of the semiconductor substrate. The second buried channel shielding region may be more lightly doped than the buried channel shielding region.

In some embodiments, the gate is positioned above the semiconductor body and has a lateral extent such that all of the edges of the gate are positioned above a portion of the first major surface comprising semiconductor material. In some embodiments, in particular embodiments in which the semiconductor device includes a further columnar trench, the gate extends over the further columnar trench and may be positioned on an insulation layer arranged on side walls of the further columnar trench.

A method for fabricating a semiconductor device is provided that comprises forming a planar gate on a first major surface of a semiconductor body, the semiconductor body further comprising a first conductivity type and a second major surface opposite the first major surface, forming a body region comprising a second conductivity type in the semiconductor body, the second conductivity type opposite the first conductivity type, the body region extending into the semiconductor body from the first major surface, forming a source region comprising the first conductivity type in the body region, forming a buried channel shielding region comprising the second conductivity type in the semiconductor body, forming a contact region comprising the second conductivity type that couples the buried channel shielding region to the source region, wherein the contact region is more highly doped than the buried channel shielding region and the buried channel shielding region is more highly doped than the body region, forming a trench extending into the semiconductor body from the first major surface, forming a field plate in the trench and forming a drain region doped with the first conductivity type under the trench.

In some embodiments, the buried channel shielding region is formed in the entire lateral extent of the semiconductor body. The method may further comprise forming a drift connection region comprising the first conductivity type in a side wall of the trench. The drift connection region may extend to the first major surface of the semiconductor body and, optionally, onto the first major surface to provide a path comprising the first conductivity type from the first major surface to the second major surface.

The drift connection region may extend along the side wall of the trench from the first major surface to the semiconductor body underlying the buried channel shielding region. In some embodiments, the buried channel shielding region is arranged on and forms a pn junction with the semiconductor body. In some embodiments, an enhancement region is formed in the first major surface and the buried channel shielding region is arranged within the enhancement region.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 1 illustrates a cross-sectional view of a semiconductor device.

FIG. 2 illustrates a cross-sectional view of another semiconductor device.

FIG. 2a illustrates an enlarged view of part of the semiconductor device in FIG. 2.

FIG. 2b illustrates a top view of a portion of the semiconductor device of FIG. 2a.

FIG. 3a illustrates a cross-sectional view of a semiconductor device.

FIG. 3b illustrates a top view of a portion of the semiconductor device of FIG. 3a.

FIG. 4b illustrates a top view of a portion of the semiconductor device of FIG. 4a.

FIG. 9b illustrates a cross-sectional view of a portion of the semiconductor device of FIG. 9a.

FIG. 9c illustrates a top view of a layout of trenches.

FIG. 9d illustrates a top view of a layout of trenches.

FIG. 13 illustrates a flow diagram of a flow chart of a method for fabricating a semiconductor device.

FIG. 14 illustrates a cross-sectional view of a flow chart of a method for fabricating a semiconductor device.

DETAILED DESCRIPTION

Figure 4A:
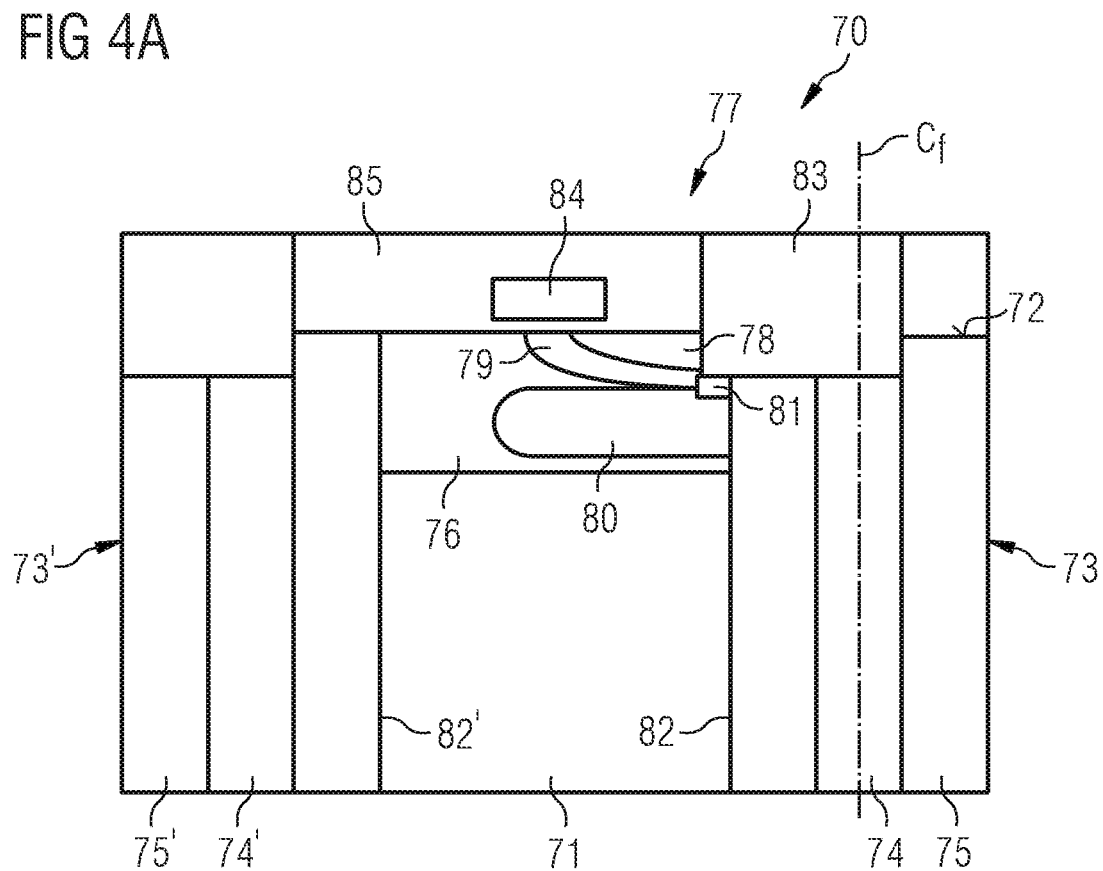
FIG. 4a illustrates a cross-sectional view of a semiconductor device.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

According to embodiments described herein, the semiconductor device comprises a transistor structure having a compensation structure in the form of a field plate in a trench and a planar gate. A channel shielding region is arranged buried within the semiconductor body. The regions of the semiconductor body extending between the trenches may be referred to as a mesa and the planar gate is arranged on the top surface of the mesa. The trench and the field plate may have a columnar form.

A columnar trench shape may be used to increase the mesa area for the current flow while maintaining lateral charge compensation. This should lead to a further reduction of the epi layer resistance as a main contribution to the overall Rdson×A.

A separate vertical gate trench may be provided that is centered in the mesa region. Since the vertical gate must extend beyond the depth of the body, the gate-drain capacitance is expected to become larger which may deteriorate the switching performance. A metal gate rather than a polysilicon gate in the gate trench may be used to keep the gate resistance Rg small. However, the formation of a metal gate in the gate trench may increase the complexity and expense of the manufacturing process.

The combination of a columnar trench with a field plate and a planar or lateral gate may be used for optimized mesa doping compensation and to reduce manufacturing complexity. By using a lateral gate and a lateral channel, a simplified process flow and layout can be used. Gate Resistance can be easily tuned to application requirements due to flexibility in choosing gate thickness and material composition. Since the gate is located at the top of the mesa, the gate may be split in two sections, which can be used to reduce the gate-drain capacitance. Additionally, body and source implantations may be self-aligned with respect to the gate such that a narrow Vgsth distribution is expected. For the split gate variant the JFET effect can be compensated by introducing a self-aligned lightly doped drain (or enhancement) implantation.

For applications with high switching speed, a further device optimization can be achieved by introducing a shielded channel planar gate on top of a columnar or needle trench compensation cell. An additional doped region, for example a buried or deep p+ implant may be used to shield the channel. The additional doped region may be denoted as a buried channel shielding region. The buried or deep p+ region may be coupled to source by a low-ohmic connection and shields the channel region above. The buried or deep p+ region may be used in addition to the enhancement implantation mentioned above.

In particular, the deep p+ implant is located below most of the channel region or the whole channel region. By varying the implantation and diffusion parameters an extra degree of freedom is created for reducing DIBL (Drain Induced Barrier Lowering) by drain potential shielding of deep p+ implant which is directly linked to minimizing the channel length and/or reducing Qgs by lowering the channel length and/or reducing Qgd by shielding effect of deep p+ and abrupt Cgd reduction after JFET pinchoff and/or improving Gox shielding from drain potential, i.e. ruggedness.

In one particular embodiment, a power MOSFET device is provided that comprises charge compensation in the form of a field-plate in a columnar or needle-shaped trench, with the field-plate connected to source, a planar Gate arrangement, an enhancement implantation and a deep p+ implant for channel shielding. The structure may be symmetrical with a dual channel or asymmetrical with a single channel.

The power MOSFET device may optionally further comprise one or more further deep p+ regions and/or a surface LDD implant.

Embodiments having an asymmetric single channel allows application to lower voltage classes as here the useable mesa width is relatively small (<1 μm). In this context it should be noted that the contribution of the MOS channel to the overall area-specific on-resistance in the medium-voltage range is typically less than 10%.

FIG. 1 illustrates a cross-sectional view of a semiconductor device 20. Typically, a semiconductor device including a transistor device such as a MOSFET device, includes a large number of substantially identical transistor structures or cells in an active area which may also be denoted as cell field. In FIG. 1, a single transistor structure 39 is illustrated for the semiconductor device 20.

The semiconductor device 20 includes a semiconductor body 21 which comprises a first conductivity type. The first conductivity may be n-type or p-type. The semiconductor body 21 comprises a first major surface 22 and a second major surface 23 that opposes the first major surface 22. The semiconductor device 20 includes a planar gate 24 arranged on the first major surface 22. The semiconductor device 20 further includes a body region 25 which extends into the semiconductor body 21 from the first major surface 22. The body region 25 comprises a second conductivity type which opposes the first conductivity type. For example, if the first conductivity type is n-type, the second conductivity type is p-type and if the first conductivity type is p-type, the second conductivity type is n-type.

The semiconductor device 20 further includes a source region 26, which comprises the first conductivity type and which is arranged in the body region 25. The semiconductor device 20 further includes a buried channel shielding region 27, which comprises the second conductivity type, and a contact region 28, which comprises the second conductivity type and which couples the buried channel shielding region 27 with the source region 26. The contact region 28 is more highly doped than the buried channel shielding region 27 and the buried channel shielding region 27 is more highly doped than the body region 25.

Each of the body region 25, the contact region 28 and the buried channel shielding region 27 comprise the second conductivity type. In embodiments in which the second conductivity type is p type, the body region 25 may have a doping concentration p, the contact region 28 a doping concentration p++ and the buried channel shielding region 27 a doping concentration p+. The source region 26 may have a doping concentration n+ and the semiconductor body 21 may have a doping concentration n.

The semiconductor device 20 further includes a field plate 29 arranged in a trench 30. The trench 30 extends into the semiconductor body 21 from the first major surface 22.

The semiconductor device 20 further includes a drain region 31 which is doped with the first conductivity type and which is arranged below the field plate 29. The drain region 31 may be arranged below the trench 30 in which the field plate 29 is positioned and spaced apart from a base 32 of the trench 30 by a portion of the semiconductor body 21. The drain region 31 may have a doping concentration n+. The drain region 31 may form the second major surface 23 of the semiconductor body. Since the drain region 31 is arranged vertically underneath the planar gate 24, and the source region 26 is arranged at the first major surface 22 of the semiconductor body 21, the transistor structure 39 may be described as a vertical transistor.

The planar gate 24 may be electrically insulated from the first major surface 22 of the semiconductor body 21 by an insulating layer 38 which may also be referred to as a gate insulating layer or gate oxide.

The field plate 29 arranged in the trench 30 may be used to provide a compensation structure for the semiconductor device 20. In some embodiments, the trench 30 has an elongate shape extending into the plane of the drawing such that the trench 30 when viewed from above the first major surface 22 has a strip-like form. In embodiments in which the trench 30 has an elongate shape, the field plate 29 also has an elongate shape extending into the plane of the drawing such that the field plate 29 when viewed from above the first major surface 22 has a strip-like form. In other embodiments, the trench 30 has a columnar form and the field plate 29 may also have a columnar form. A columnar trench 30 may have a needle-shaped or specular form. A columnar trench may have a lateral cross section when viewed in plan view or from above the first major surface 22 which is substantially circular, square or hexagonal, for example.

In embodiments in which the trench 30 has an elongate shape in plan view, the active area of the semiconductor device 20 may include a plurality of substantially parallel strip-like trenches. In embodiments in which the trench 30 is columnar, the trenches may be arranged in a regular array, for example, a square grid array or a hexagonal close packed array in which the columnar trenches of adjacent rows of trenches are offset with respect to one another.

Typically, the sidewalls 33 and base 32 of the trench 30 are lined with an insulating material 37, typically referred to as a field oxide, which electrically isolates the field plate 29 form the semiconductor body 21. The field plate 29 may be coupled to the source region 26 or to source potential or may be coupled to the gate 24 or gate potential.

The buried channel shielding layer 27 is arranged in the semiconductor body 21 such that its uppermost surface 35 is spaced apart from the first major surface 22 and its lowermost surface 34 is spaced apart from the second major surface 23. A pn junction is formed between the lower surface 34 of the buried channel shielding region 27 and the underlying semiconductor body 21 which is positioned at a depth $d_s$ from the first major surface. The trench 30 has a depth $d_t$ from the first major surface 22 and the lower surface of the field plate 29 has a depth $d_f$ from the first major surface 22. The depth $d_t$ and depth $d_f$ are greater than the depth $d_s$ of the pn junction from the first major surface 22.

The source region 26, the body region 25 and the buried channel shielding region 27 extend laterally from the trench 30, in particular, laterally from the side wall 33 of the trench 30. The source region 26, the contact region 28, the buried channel shielding region 27 and, optionally, the body region 25 may form a portion of the side wall 33 of the trench 30 and be electrically insulated from the field plate 29 within the trench 30 by the insulating layer 37.

The source region 26 may have the form of a well which extends from the first major surface 22 into the semiconductor body 20. The source region 26 in the form of a well may have a lateral extent such that its distal region is arranged under an edge 36 of the planar gate 24. The edge 36 of the planar gate may face towards the trench 30. The body region 25 may also have the form of a well which surrounds the source region 26 such that the source region 26 is not in direct contact with the semiconductor body 21. The body region 25 may also extend under the planar gate 24. The buried channel shielding layer 27 may be arranged under the source region 26 and under the gate body region 25 and have a lateral extent such that it extends partially under the planar gate 24 and partially adjacent the edge 36 of the planar gate 24. In some embodiments, the contact region 28 extends between the source region 26 and the buried channel shielding region 34 and may extend into the buried channel shielding region 27.

In some embodiments, at least a portion of the buried channel shielding region 27 is spaced apart from the body region 25 by region of the semiconductor body 21. The buried channel shielding region 27 is coupled to the body region 21 by the contact region 28. In other embodiments, the buried channel shielding region 27 may partially overlap with the body region 25 or may be enclosed within the body region 25.

The distal end of the body region 25 and a distal region of the buried channel shielding region 27 may be positioned under the planar gate 24, as in the embodiment illustrated in FIG. 1 for example. In some embodiments, the buried channel shielding region 27 extends under the entire lateral extent of the planar gate 24. The arrangement of the source region 26, the body region 25, the buried channel shielding region 27 and the contact region 28 may be symmetrical with respect to edges of the planar gate 24 or may be asymmetric with respect to edges of the gate 24. For example, in an asymmetric arrangement, the source region 26 body region 25, contact region 28 and buried channel shielding region 27 may be arranged at only one edge 36 of the gate 24 as illustrated in FIG. 1.

In some embodiments, the semiconductor body 21 is formed by a semiconductor wafer, such as silicon wafer. In some embodiments, the semiconductor body 21 is formed by an epitaxial layer grown on a further substrate. For example, the semiconductor body 21 may be an epitaxial n-doped silicon layer which is arranged on a silicon wafer, highly doped with the first conductivity type or the second conductivity type.

FIG. 2a illustrates a cross-sectional view of a portion of a transistor structure 59 of a semiconductor device 40 shown in FIG. 2 and in which the first major surface 41 and second major surface 42 of the semiconductor body 43 of the semiconductor device 40 can be seen. The insert of FIG. 2a illustrates an enlarged view of the region of the semiconductor device 40 adjacent the first major surface 41. FIG. 2b illustrates a plan view of the semiconductor device 40 and in particular, the first major surface 41 and illustrates a portion of the first major surface 41 with a single trench 47. Portions of the semiconductor body 43 extending between the trenches 47 may be referred to a mesas.

A planar or lateral gate 44 and source metal 46 are arranged at the first major surface 41 and a drain contact 45 is arranged on the second major surface 42. The semiconductor device 40 includes a plurality of trenches 47 which extend into the semiconductor body 43 from the first major surface 41 to a depth dt. The planar gate 44 is arranged on the mesa formed between the trenches 47.

The semiconductor device 40 includes a drain region 48 which is highly doped with the first conductive conductivity type. In this particular embodiment, the drain region 48 forms the second major surface 42 of the semiconductor body 43. However, the highly doped drain region 48 and drain metal contact 45 may have other arrangements. For example, the metal drain contact 45 may be arranged on the first major surface 41 and be coupled to highly doped drain region 48 by a conductive via. The highly doped drain region 48 may be arranged within the semiconductor body 43 or between the semiconductor body 43 and a further substrate arranged on the second major surface 42, for example.

The semiconductor device 40 has a symmetric transistor structure 59 with respect to the planar gate 44. The transistor structure 59 includes a source region 49 in the form of a well extending from the first major surface 41 into the semiconductor body 43 such that it has a distal end positioned under an edge of the planar gate 44 and extends in the direction of the side wall 50 of the trench 47. The transistor structure further includes a body region 51 which surrounds the source region 49, a contact region 52 and a further doped region 53 which is positioned underneath the body region 51 and therefore at a greater depth from the first major surface 41 than the deepest point of the body region 51. The further doped region 53 may provide a buried channel shielding region.

The body region 51 and further doped region 53 comprise the second conductivity type and the source region 49 comprises the first conductivity type. The source region 49 is more highly doped that the semiconductor body 43. The further doped region 53 may be more highly doped than the body region 51. The contact region 52 electrically couples the further doped region 53 a source metal contact metal contact 54 which is arranged above the trench 47. The contact region 52 may be more highly doped than the further doped region 53.

The metal contact 54 may also extend into the semiconductor body 43 and be in direct contact with the contact region 52, the body region 51 and the source region 49. The trench 47 may include a conductive field plate 55 which is electrically coupled to the metal contact 54 and which is electrically insulated from the semiconductor body 43 by an insulating layer 56 which lines the side walls 50 and base of the trench 47. The field plate 55 and the metal contact 54 may be coupled to source in embodiments in which the metal contact 54 is in direct contact with the source region. The metal contact 54 extends into the semiconductor body 43 from the first major surface 41 in order to make direct contact with the source region 49, the body region 51, the contact region 52 and the field pate 55. The metal contact 54 has a lateral extent which is larger than the lateral extent of the trench 47 at least on the gate side 50 of the trench 47.

The planar gate 44 is surrounded by an insulation layer 58 which spaces the lower surface of the planar gate 44 from the first major surface 41 and electrically and insulates the planar gate 44 from the metal contact 54.

The further doped region 53 extends from the side wall 50 of the trench 47 under the edge of the planar gate 44 and may have a lateral extent which is less than, approximately equal to, or greater than the lateral extent of the body region 51.

In this particular embodiment, the semiconductor device 40 also includes an enhancement region 57 which extends from the first major surface 41 into the semiconductor body 43 to a depth de. The enhancement region 57 is doped with the first conductivity type and may be more highly doped than the semiconductor body 43. In this particular embodiment, the source region 49, the body region 51, the contact region 52 and the further doped region 53 are positioned within the enhancement region 57. The depth $d_e$ of the enhancement region 57 from the first major surface 41 is less than the depth $d_t$ of the trenches 47.

As discussed above, the transistor structure 59 of this embodiment is symmetrical with respect to the planar gate 44 so that the source region 49', body region 51', contact region 52' and further doped region 53' extend from the side wall 50' of the trench 47' positioned on the opposite edge of the planar gate 44 such that the transistor structure is mirror symmetrical about a centreline C through the planar gate 44 in the cross-sectional view of FIG. 2a.

As can be seen from the plan view of FIG. 2b, the trenches 47 have a columnar form and are substantially circular in plan view. The gate planar gate 44 surrounds the trench 47 on all sides and therefore has can be considered to have a continuous structure including openings which surround and are spaced apart from the metal contacts 54 by a portion of the insulation layer 58. The metal contacts 54 are substantially circular and are substantially concentric with the columnar trench 47 and the columnar field plate 55 within the trench 47. The lateral shape of the trench 47 and field plate 55 is not limited to a circular form and may have other forms such as hexagonal, square, octahedral, for example.

FIG. 3a illustrates a cross-sectional view and FIG. 3b a plan view of a portion of a semiconductor device 60 including a transistor structure that is similar to that illustrated in FIG. 2a, but differs in the arrangement of the planar gate 44. Like reference numerals designate corresponding similar parts.

In the embodiment illustrated in FIGS. 3a and 3b, the planar gate 44 has the form of a ring 61. In particular, the ring-shaped planar gate 61 is arranged on the first major surface 41 of the semiconductor body 43 and is concentrically arranged with the trench 47 and with the field plate 55 arranged within the trench 47. The width of the ring-shaped gate 61 may be substantially uniform. The ring-shaped gate 61 is spaced apart from the contact metal 54 by a portion of the insulating layer 58.

Portions of two ring shaped gates 61 and 61' are arranged in mesa regions between immediately neighbouring trenches 47, 47' which are separated from one another by a portion of the insulating layer 58. The source region 49, the body region 51, the further doped region 53, and the contact region 52 that are arranged adjacent the sidewall 50 of the trench 47 are associated with the gate 61. The source 59', the body region 51', the contact region 52', and the further doped region 53' that are arranged adjacent the side wall 50' of the trench 47' are associated with the gate 61'.

As can be seen in the plan view of the FIG. 3b, each ring-shaped gate 61 may be electrically coupled to a further ring-shaped gate by connection portions 62. Whilst in FIG. 3b, the ring-shape of the planar gate 61 is substantially circular in plan view, the ring-shaped gate is not limited to a circular ring but may also have other forms such as square or octagon.

Figure 4B:
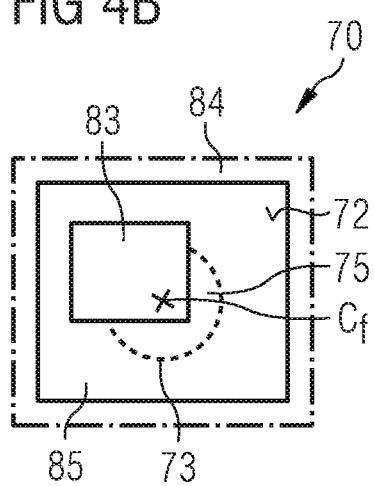

FIG. 4a illustrates a portion of a cross-sectional view of a portion of a semiconductor device 70. FIG. 4b illustrates a plan view of a portion of a first major surface 72 of the semiconductor device 70.

The semiconductor device 70 includes a semiconductor body 71 comprising a first conductivity type and illustrates two trenches 73, 73' extending from the first major surface 72 of the semiconductor body 71 into the semiconductor body 71. Each of the trenches 73, 73' comprises a field plate 74, 74' which is insulated from the semiconductor body 71 by an insulating layer 75, 75' which lines the sidewalls and base of the trench 73, 73'. The semiconductor device 70 also includes an enhancement region 76 comprising the first conductivity type which extends from the first major surface 72 into the semiconductor body 71.

The semiconductor device 70 includes a transistor structure 77 comprising a source region 78 comprising the first conductivity type which has the form of a well formed in the first major surface 72. The transistor structure 77 further comprises a body region 79, which comprises the second conductivity type and which surrounds the source region 78, and a further doped region 80. The further doped region 80 also comprises the second conductivity type and is more highly doped than the body region 79. The further doped region 80 partially overlaps with a lower surface of the body region 79 underneath the source region 78. The transistor structure 77 further includes a contact region 81 which is heavily doped with the second conductivity type which is arranged at the interface between the body region 79 and the further doped region 80. The contact region 81 couples the further doped region 80 with a contact 83 which is arranged partially on the trench 73. The further doped region 80 may provide a channel shielding region and may be described as buried as it is positioned at a distance from the first major surface 72 and makes no direct contact with the first major surface 72.

The contact 83 may comprise one or more metals or alloys or highly-doped polysilicon. The contact 83 is electrically coupled to the field plate 74 and extends into the semiconductor body 71 such that it is in direct contact with the source region 78, the contact region 81 and optionally the body region 79.

The trenches 73, 73' are columnar and are arranged in a regular array extending from the first major surface 72 into the semiconductor body 71. The semiconductor device 70 may be considered to include an asymmetric structure as it includes a transistor structure 77 adjacent alternate trenches only. Starting from the first major surface 72 and proceeding in the direction of the second major surface and base of the trench 73, the sidewall 82 of the trench 73 is formed by the source region 78, contact region 81, further doped region, enhancement region 76 and semiconductor body 71, whereas the sidewall 82' of the trench 73' is formed by the enhancement region 76 and an underlying portion of the semiconductor body 71.

With respect to a centreline $C_f$ of the field plate 74, the contact 83 can be considered to be asymmetric since it has a lateral extent to the left which is greater than to the right of the centreline $C_f$ of the field plate 74. The source region 78 can be considered to extend from the contact 83 towards the gate 84 which is arranged on the first major surface 72 above the semiconductor body 71 and between the trenches 73, 73'. The gate 84 is a planar gate and is surrounded by an insulating layer 85 which also extends onto a portion of the trench 73' and in particular, onto a portion of the insulating layer 75' in the trench 73' which remains uncovered by the metal contact 83'.

In the plan view of FIG. 4b, the offset or asymmetric arrangement between the metal contact 83 and the columnar trench 73 can be seen. Due to the offset or asymmetric arrangement between the metal contact 83 and the columnar trench, a portion of the insulating layer 75 and a portion of the trench 73 is uncovered by the metal contact 83. The gate 84 may be arranged at substantially the same distance from the trench 73 and may be concentric with a longitudinal axis of the trench 73.

The source region 78 has a lateral extent such that it is positioned under the edge 86 of the gate 84 which faces the trench 73. The body region 79 has a lateral extent which is greater than the lateral extent of the source region 78 and is positioned under the gate 84. The further doped region 80 extends from the side face 82 of the trench to an extent that is slightly greater than the lateral extent of the body region 79.

In the embodiment illustrated in FIG. 4a, the further doped region 80 is positioned entirely within the enhancement region 76 and is partially separated from portions of the body region 79 arranged under the gate 84 by a portion of the enhancement region 76. The contact region 82 partially overlaps with the body region 79 and with the further doped region 80 in regions immediately adjacent the sidewall 80 of the trench 73.

Figure 5:
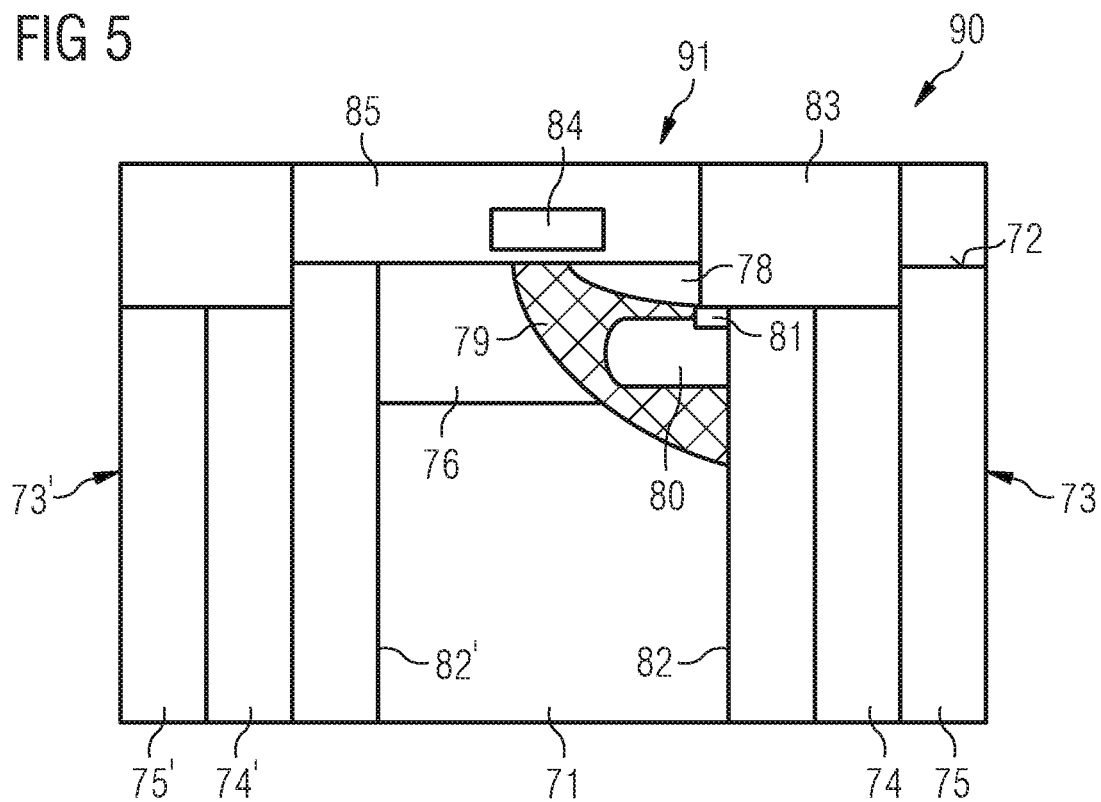
FIG. 5 illustrates a cross-sectional view of a semiconductor device.

FIG. 5 illustrates a cross-sectional view of a portion of a semiconductor device 90 and illustrates two trenches 73, 73' each including a field plate 74, 74' having a similar arrangement to that illustrated in FIG. 4. Like reference numerals designate corresponding similar parts. The semiconductor device 90 includes a transistor structure 91 that differs from that illustrated in FIG. 4 in the arrangement of the body region 79.

The transistor structure 91 includes a source region 78 comprising the first conductivity type that is positioned in a well at the first major surface 72 and which extends from a metal contact 83 which is arranged partially in the trench 73 and extends into the semiconductor body 71. The further doped region 80 comprises the second conductivity type and is arranged below and spaced apart from the source region 78. The contact region 81 forms part of the side wall 82 of the trench 73 and extends from the further doped region 80 to the metal contact 83. The contact region 81 electrically couples the further doped region 80 with the source region 78 such that the further doped region 80 provides a buried channel shielding layer.

In the embodiment illustrated in FIG. 5, the body region 79 extends from the first major surface into the semiconductor body 71 underneath a portion of the enhancement region 76. The body region 79 forms a pn junction with a portion of the semiconductor body 71 in a region adjacent the side wall 82 of the trench 73. The source region 78, the contact region 81 and the further doped region 80 are positioned entirely within the body region 79. The further doped region 80 may have a lateral extent which such that it extends only under a single gate edge, in particular the edge of the gate 84 facing the trench 73. In the embodiment illustrated in FIG. 5, the lateral extent of the further doped region 80 may be less than the lateral extent of the further doped region 80 illustrated in the embodiment of FIG. 4.

Figure 6:
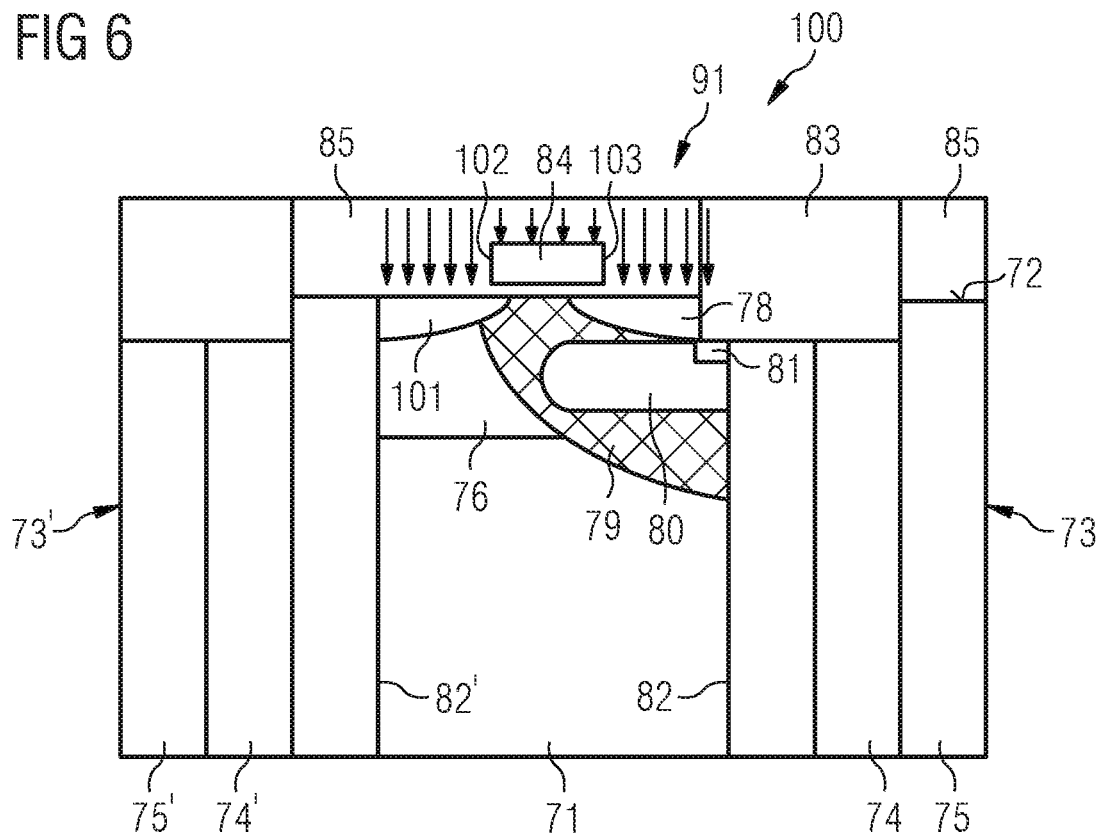
FIG. 6 illustrates a cross-sectional view of a semiconductor device.

FIG. 6 illustrates a semiconductor device 100 having a transistor structure 91 similar to that illustrated in FIG. 5, whereby like reference numerals designate corresponding similar parts. The semiconductor device 100 comprises an additional doped well 101 which is positioned at the first major surface 72 and extends from the sidewall 82' of the trench 73' under the edge 102 of the gate 84 which opposes the edge 103 of the gate 84 under which the source region 78 extends. The additional doped well 101 comprises the first conductivity type and is more highly doped than the enhancement region 76. The additional doped well 101 may be considered to be a laterally diffused drift zone (LDD).

Figure 7:
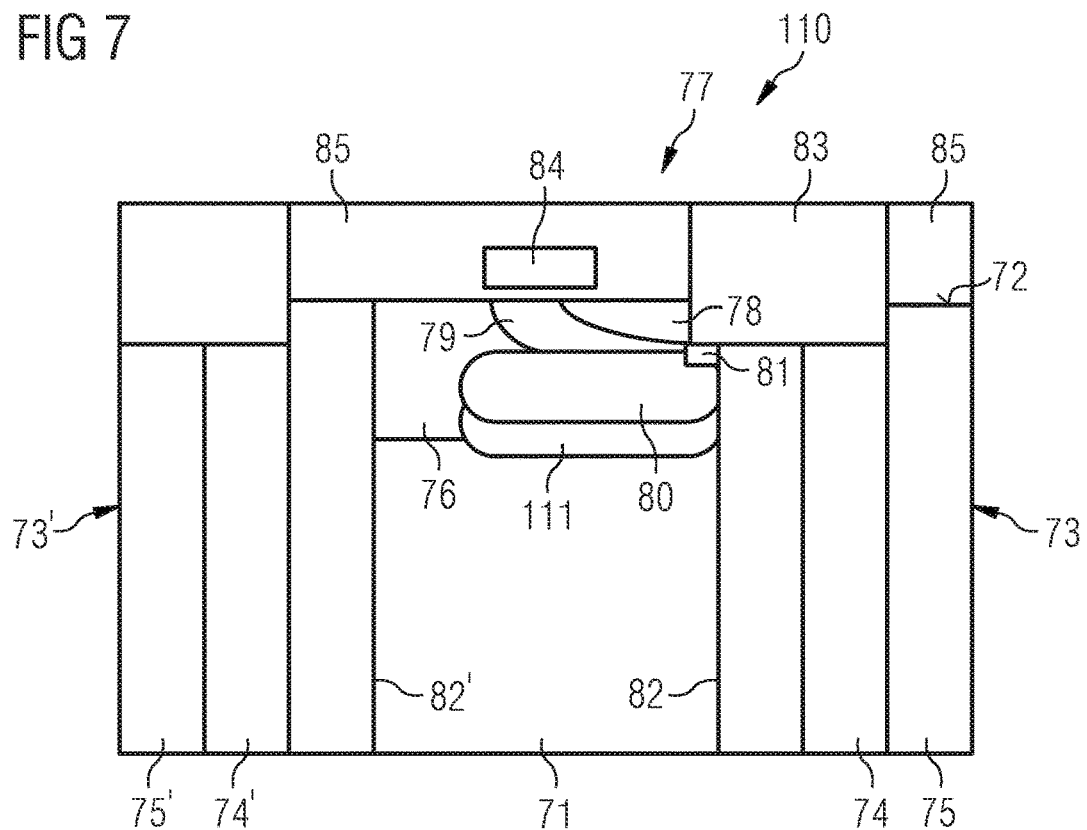
FIG. 7 illustrates a cross-sectional view of a semiconductor device.

FIG. 7 illustrates a view of a portion of a semiconductor device 110 including a transistor structure 77, semiconductor body 71 and columnar trenches 73, 73' with a field plate 74, 74' as illustrated in FIG. 4, whereby like reference numerals designate corresponding similar parts. The semiconductor device 110 differs from the embodiment illustrated in FIG. 4 in that it includes an additional or second further doped region 111 that provides a second buried channel shielding region.

The further doped region 111 comprises the second conductivity type and is positioned underneath, and overlaps with, the further doped region 80 that provides the first buried channel shielding region. The further doped region 111 is less highly doped than the further doped region 80 and may have a lateral extent which is substantially the same as the lateral extent of the further doped region 80. The second buried doped region 111 may extend over the interface between the enhancement region 76 and semiconductor body 71 and into the semiconductor body 71 forming a pn junction with the semiconductor body 71. The further doped region 111 may also form a part of the sidewall 82 of the trench 73.

Figure 8:
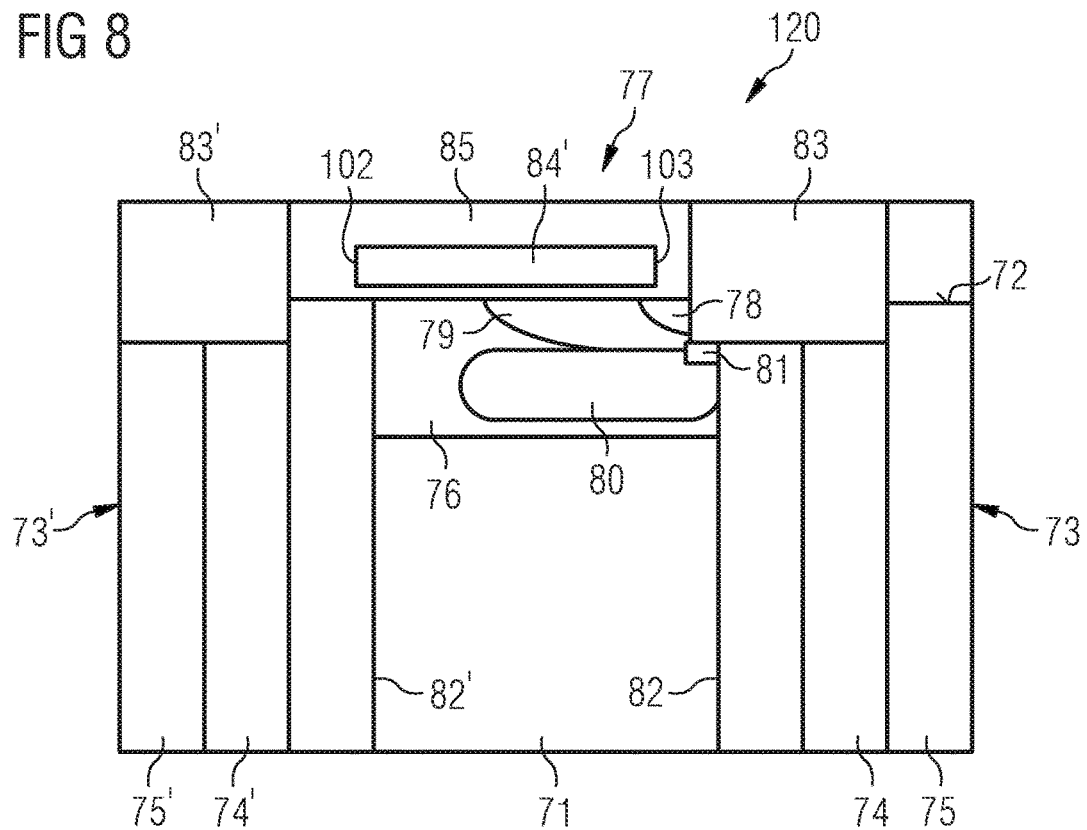
FIG. 8 illustrates a cross-sectional view of a semiconductor device.

FIG. 8 illustrates a cross-sectional view of a portion of a semiconductor device 120 according to an embodiment. The semiconductor device 120 includes a semiconductor body 71 and columnar trenches 73, 73' including field plate 74, 74' and a semiconductor transistor structure 77 corresponding to that illustrated in FIG. 4, whereby like reference numerals designate corresponding similar parts. The semiconductor device 120 differs from the semiconductor device 70 illustrated in FIG. 4 in the form of the planar gate. In the semiconductor device 120, the planar gate 84' extends over the trench 73' such that it is positioned on a portion of the insulating layer 75' lining the sidewall 82' of the trench 73'. The planar gate 84' is insulated from the semiconductor body 71 and contact 83' by a portion of the insulating layer 85.

Figure 9A:
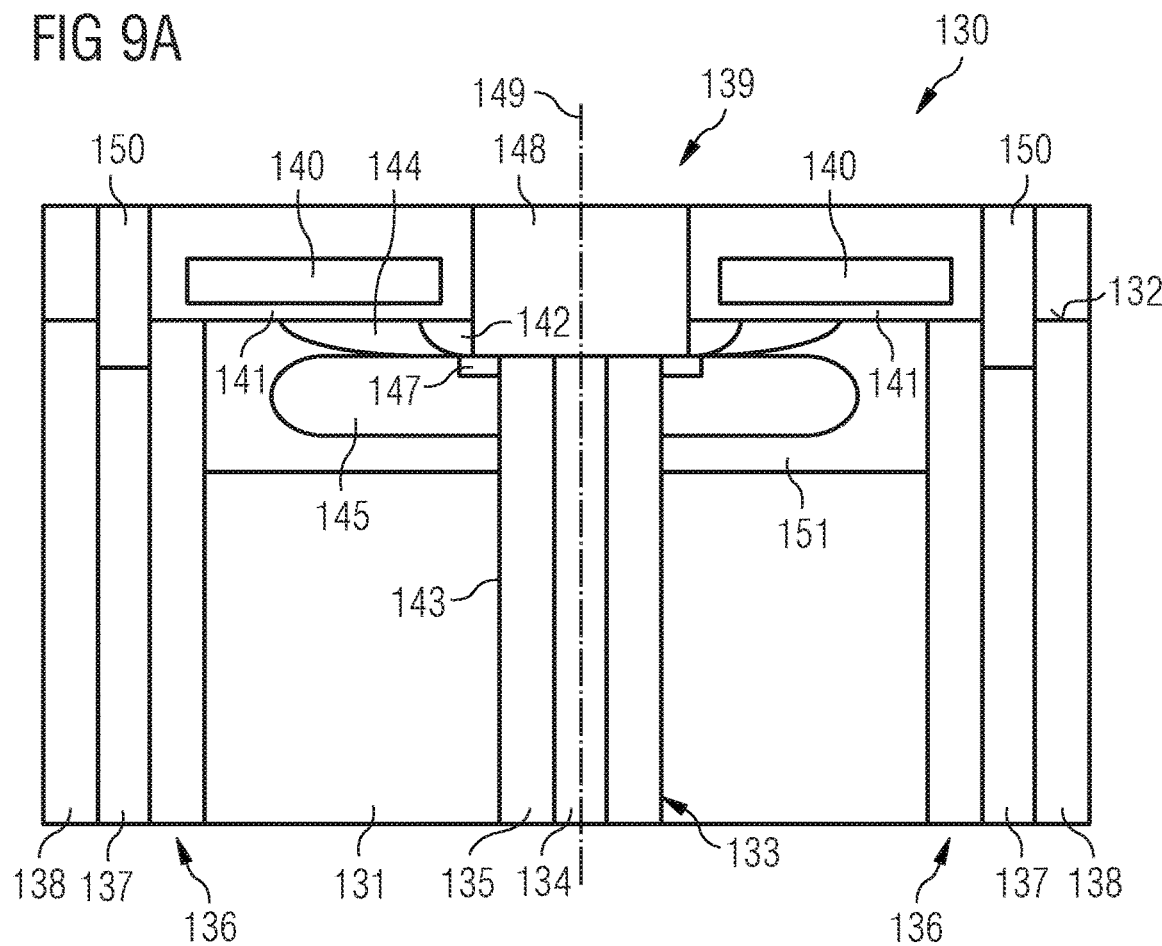
FIG. 9a illustrates a cross-sectional view of a semiconductor device.

FIG. 9a illustrates a cross-sectional view of a portion of a semiconductor device 130 comprising a semiconductor body 131 comprising a first conductivity type, in this particular embodiment, n-type. The semiconductor body 131 has a first major surface 132 and a second major surface opposite the first major surface which cannot be seen in the portion of the semiconductor body 131 illustrated in FIG. 9a. The semiconductor device 130 includes a plurality of first trenches 133 of which one can be seen in the view of FIG. 9a, each comprising a field plate 134 which is electrically insulated from the semiconductor body 131 by an insulating layer 135 and a plurality of second trenches 136, of which two can be seen in the view of FIG. 9a. A second trench 136 is arranged on at least two opposite sides of the first trench 133. Each second trench 136 includes a further field plate 137 which is electrically insulated from the semiconductor body 131 by an insulating layer 138 lining the trench 136.

The semiconductor body 130 includes a transistor structure 139 which is symmetric about the first trench 133. The transistor structure 139 includes a planar gate 140 which is arranged on the first major surface 132 and electrically insulated from the semiconductor body 131 by insulating layer 141 which may be considered as a gate oxide. The planar gate 140 extends onto the insulating material 138 in the immediately adjacent second trench 136. The transistor structure 139 comprises a source well 142 comprising the first conductivity type which extends into the semiconductor body 131 from the first major surface 132 adjacent a sidewall 143 defining the trench 133. The transistor structure 139 further includes a body region 144 which surrounds the source region 142 and extends under the planar gate 140, a buried channel shielding region 145 which overlaps with the portion of the body region 144 and which extends from the sidewall 143 under the planar gate 140.

The body region 144 comprises the second conductivity type and forms a pn junction with the source region 140. The buried channel shielding region 145 comprises the second conductivity type, in this embodiment, p-type and is more highly doped than the body region 144. The transistor structure 139 further includes a contact region 147 comprising the second conductivity type. The contact region 147 couples the buried channel shielding region 145 to the source region 142 and in this embodiment is in direct contact with the buried channel shielding region 145, the body region 144 and the source region 142. A contact region, for example a first metal contact 148 is arranged on and is electrically coupled to the field plate 134 arranged in the first trench 133.

The first metal contact 148 may have a lateral extent which is greater than the lateral extent of the trench 133 such that it extends into the semiconductor body 131 at the first major surface 132 and is in direct contact with the source region 144 and contact region 147. The arrangement of the source metal contact 148, source region 142, body region 144, buried channel shielding region 145 contact region 147 and planar gate 140 is mirror symmetrical about a longitudinal axis 149 of the trench 133.

The plurality of second trenches 136 are defined by material of the semiconductor body 131 and comprise a metal contact 150 which is electrically coupled to the field plate 137 in the trench 136. The metal contact 150 may have a lateral extent which is less than the lateral extent of the trench 136 and less than the lateral extent of the contact 148.

Figure 9B:
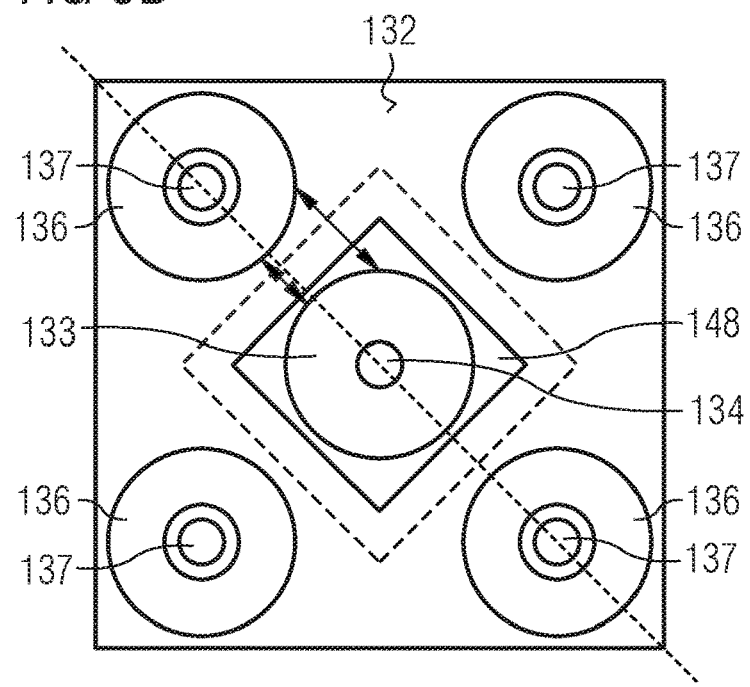

As illustrated in the plan views of FIGS. 9b to 9d, in this embodiment, the first trenches 133 and the second trenches 136 each have a columnar form. For example, the first trench 133 may be substantially circular in plan view. The plurality of second trenches 136 are also columnar and may also have a substantially circular shape in plan view.

The first trenches 133 may be arranged alternately with the second trenches 136 in to form a regular array. In some embodiments, the trenches 136 may be arranged in two or more rows and the trenches 133 may be arranged in two or more rows. The first trenches 133 may be offset or staggered with respect to the second trenches 136 and vice versa to form a hexagonal close packed type arrangement in plan view, as in the embodiments illustrated in FIGS. 9b and 9c.

In other embodiments, such as that illustrated in FIG. 9d, the first and second plurality of trenches 136, 133 are formed in a square grid array.

In some embodiments, the semiconductor body 131 may also comprise an enhancement region 151 which extends into from the first major surface 132 into the semiconductor body 131. The enhancement region 151 comprises the first conductivity type and may be more highly doped than the remainder of the semiconductor body 131. In some embodiments, the enhancement region 151 has a depth from the first major surface 132 such that the buried channel shielding region 145 is arranged entirely within the enhancement region 151. However, in some embodiments, the buried channel shielding region 145 may be positioned such that it is in direct contact with the semiconductor body 131 at a lower surface and is in contact with enhancement region 151 at an upper surface.

Figure 10:
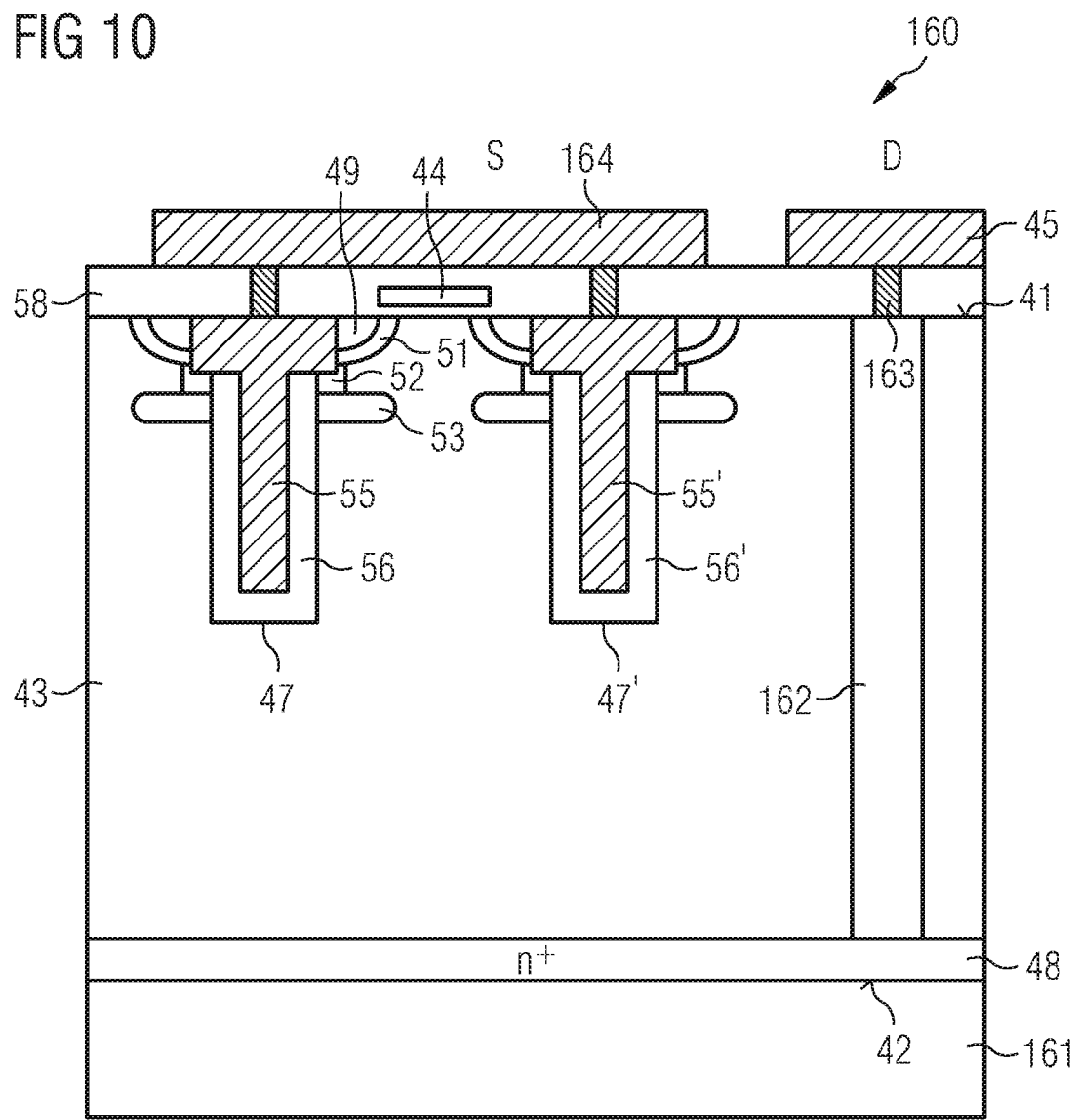
FIG. 10 illustrates a cross-sectional view of a semiconductor device.

FIG. 10 illustrates a semiconductor device 160 which has a transistor structure 59 and trenches 47, 47' similar to the embodiment illustrated in FIG. 2a. Like reference numerals designate corresponding similar parts. The semiconductor device 160 differs from the semiconductor device 40 in the arrangement of the drain region 48 and drain metal contact 45.

In the embodiment illustrated in FIG. 2a, the semiconductor device 40 comprises a drain region 48 at the second major surface 42 of the semiconductor body 43 and a drain metal contact 45 arranged on the second major surface 42. In the semiconductor device 160 illustrated in FIG. 10, the drain region 48 is positioned within semiconductor device 40 and, in particular, on a further substrate 161 so that it is positioned between the substrate 110 and the semiconductor body 43. In this embodiment, the semiconductor device 160 includes a drain metal contact 45 which is positioned on the first major surface 41 rather than on the second major surface 42.

The semiconductor device 160 includes a conductive region 162 which extends from the first major surface 42 to the drain region 48. The conductive region 162 may be provided by a conductive via which may comprise one or more metal liners or may be filled with a metal. Alternatively, the conductive region 162 may comprise a highly doped region of the substrate. The drain metal contact 45 may be coupled to the conductive region 162 positioned within the semiconductor body 43 by a conductive redistribution structure which may include one or more conductive vias 163 which extend through insulating layer 58 arranged on the first major surface 42 of the semiconductor body 43. The semiconductor device 160 includes a source metal contact 164 which is electrically coupled to the metal contacts 54 arranged in the trenches 50. The source metal contact 164 is electrically insulated from the drain metal contact 45 by intervening regions of the insulation layer 58. The planar gate 44 is also coupled to a gate metal contact which cannot be seen in the cross-sectional view of FIG. 10.

In the embodiments illustrated in FIGS. 1 to 10, the buried channel shielding region extends laterally only over a portion of the semiconductor body such that there is a continuous path of material comprising the first conductivity type, in some embodiments comprising the semiconductor body only and in other embodiments, comprising the enhancement region and the semiconductor body, between the first major surface and the drain region.

In other embodiments, the buried channel shielding region comprising the second conductivity type is first formed as a continuous layer which extends over the entire lateral area of the semiconductor body and, afterwards, a further connection zone comprising the first conductivity type, which may be thought of as a drift connection zone, is formed which extends from the first major surface through the buried channel shielding layer to the semiconductor body.

Figure 11:
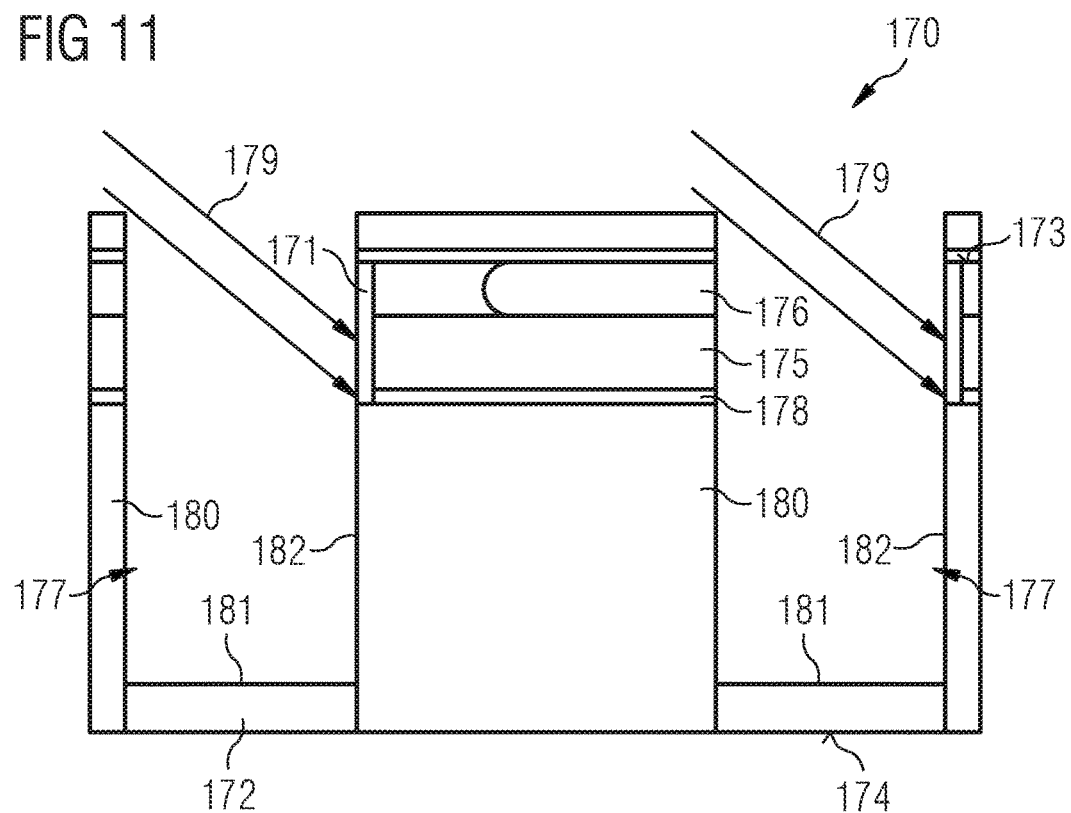
FIG. 11 illustrates a cross-sectional view of fabrication of a semiconductor device including a drift connection region.

FIG. 11 illustrates an example of a semiconductor device 170 including a drift connection zone 171. The semiconductor device 170 includes a semiconductor body 172 including a first major surface 173 and a second major surface 174 which opposes the first major surface 173. The semiconductor body 172 comprises first conductivity type and may be provided by an epitaxial layer, for example an epitaxial layer of silicon, or a wafer, for example as silicon wafer. The semiconductor device 170 may be fabricated by implanting donors, for example phosphorous, to form an enhancement region 178 which extends from the first major surface 173 into the semiconductor body 172, and implanting acceptors, such as boron, to form a buried channel shielding layer 175 which extends continuously throughout the semiconductor body 172. Acceptors are also implanted to form a body region 176 which is arranged between the first major surface 173 and the buried channel shielding layer 175 but which extends laterally only over portions of the semiconductor body 172, for example, in regions adjacent alternate trench positions. The buried channel shielding region 175 may be more highly doped than the body region 176.

A plurality of trenches 177 may be formed in the first major surface 173 which have a first side wall 180 formed, in a direction from the first major surface 173 to the second major surface 174, by the body region 173, the channel shielding region 175, the enhancement region 178 and the semiconductor body 172, a base 181 formed by the semiconductor body 172 and a second side wall 182 formed by, in a direction from the first major surface 173 to the second major surface 174, the enhancement region 178, the buried channel shielding region 175, the enhancement region 178 and the semiconductor body 172.

In order to provide a conductive path from the first major surface 173 to the second major surface 174, a drift connection zone 171 comprising the first conductivity type may be formed by implanting acceptors into a portion of the side wall 182 of the trench 177 as indicated by the arrows 179 in FIG. 11 to produce a drift connection zone 171 comprising the first conductivity type which extends from the first major surface 173 to the semiconductor body 172 underneath the enhancement region 178.

Figure 12:
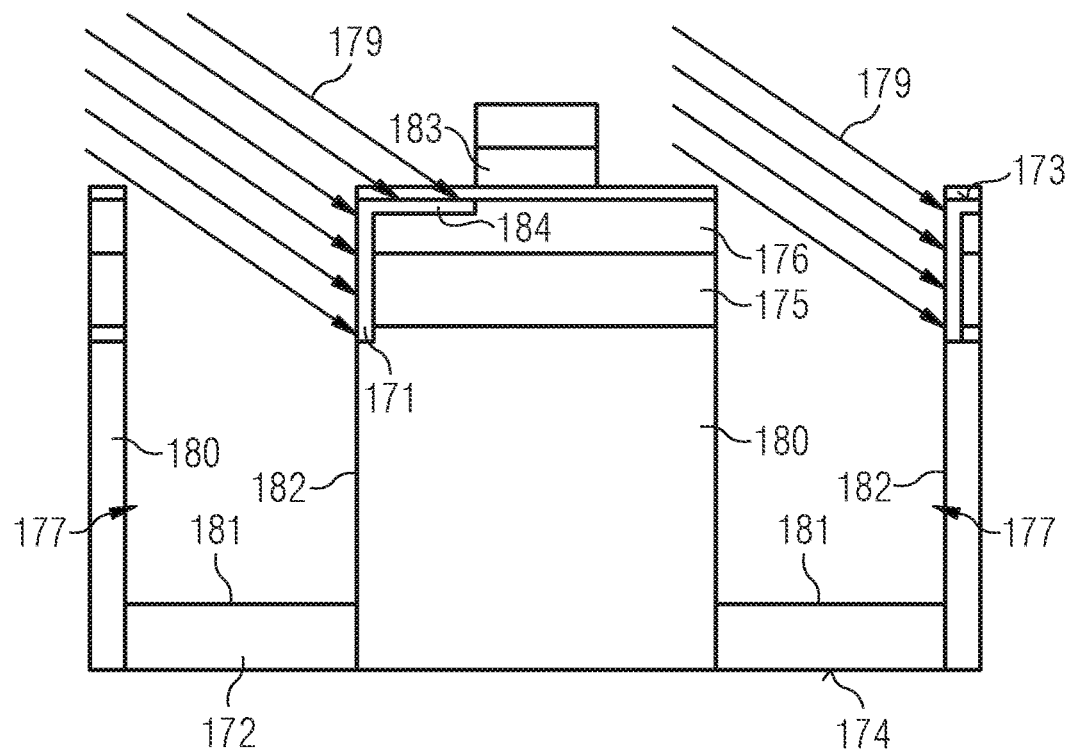
FIG. 12 illustrates a cross-sectional view of a stage in the fabrication of a semiconductor device including a drift connection region.

In other embodiments, such as that illustrated in FIG. 12, the drift connection region 171 may also extend into a well 184 extending from the side wall 182 of the trench 177 at the first major surface 173 to a gate 183 arranged on the first major surface 173 above the body region 176. In these embodiments, the body region 176 may also be provided by a continuous layer that extends throughout the lateral area of the semiconductor body 172. After formation of the drift connection zone 171, the trenches 177 may be lined with an insulating material and a conductive field plate formed within the insulating material.

FIG. 13 illustrates a flow diagram of a flow chart 190 of a method for fabricating a semiconductor device.

In box 191, a body region comprising a second conductivity type is formed in a semiconductor body. The body region extends into the semiconductor body from the first major surface. The semiconductor body comprises a first major surface and a second major surface opposite the first major surface. The semiconductor body comprises a first conductivity type. The second conductivity type opposes the first conductivity type. In box 192, a source region comprising the first conductivity type is formed in the body region. In box 193, a buried channel shielding region comprising the second conductivity type is formed in the semiconductor body. In box 194, a contact region comprising the second conductivity type is formed that couples the buried channel shielding region to the source region. The contact region is more highly doped than the buried channel shielding region and the buried channel shielding region is more highly doped than the body region. In box 195, a trench is formed in the first major surface that that extends into the semiconductor body from the first major surface. In box 196, a field plate is formed in the trench. In box 197, a planar gate is formed on a first major surface of a semiconductor body. In box 198, a drain region doped with the first conductivity type is formed under the trench.

FIG. 14 illustrates a cross-sectional view of a flow chart 200 of a method for fabricating a semiconductor device.

In box 201, a body region comprising a second conductivity type is formed in a semiconductor body. The body region extends into the semiconductor body from the first major surface. The semiconductor body comprises a first major surface and a second major surface opposite the first major surface. The semiconductor body comprises a first conductivity type. The second conductivity type opposes the first conductivity type. In box 202, a source region comprising the first conductivity type is formed in the body region. In box 203, a buried channel shielding region comprising the second conductivity type is formed in the semiconductor body. The buried channel shielding region is formed in the entire lateral extent of the semiconductor body. In box 204, a contact region comprising the second conductivity type is formed that couples the buried channel shielding region to the source region. The contact region is more highly doped than the buried channel shielding region and the buried channel shielding region is more highly doped than the body region. In box 205, a trench is formed in the first major surface that that extends into the semiconductor body from the first major surface. In box 206, a drift connection region comprising the first conductivity type is formed in a side wall of the trench. The drift connection region extends to the first major surface of the semiconductor body and, optionally, onto the first major surface to provide a path comprising the first conductivity type from the first major surface to the semiconductor body. In box 207, a field plate is formed in the trench. In box 208, a planar gate is formed on a first major surface of a semiconductor body. In box 209, a drain region doped with the first conductivity type is formed under the trench.

In the embodiments describe above, the semiconductor body may have a doping concentration which is usefully in the range of $1.10^{15}$ cm$^{-3}$ to $5.10^{17}$ cm$^{-3}$, conveniently in the range of $5.10^{15}$ cm$^{-3}$ to $1.10^{17}$ cm$^{-3}$, and more conveniently in the range of $1.10^{16}$ cm$^{-3}$ to $5.10^{16}$ cm$^{-3}$, but higher or lower doping concentrations may also be used. The drain region may have doping concentration usefully at least $1.10^{19}$ cm$^{-3}$, conveniently at least $3.10^{19}$ cm$^{-3}$ and more conveniently at least $6.10^{19}$ cm$^{-3}$, but higher or lower doping concentrations may also be used. The source region may have doping concentration usefully of at least $5.10^{19}$ cm$^{-3}$, conveniently of at least $1.10^{20}$ cm$^{-3}$, and more conveniently of at least $3.10^{20}$ cm$^{-3}$, but higher or lower doping concentrations may also be used. The enhancement region may have a doping concentration usefully in the range of $1.10^{17}$ cm$^{-3}$ to $2.10^{18}$ cm$^{-3}$, conveniently in the range of $3.10^{17}$ cm$^{-3}$ to $1.10^{18}$ cm$^{-3}$, and more conveniently in the range of $5.10^{17}$ cm$^{-3}$ to $9.10^{17}$ cm$^{-3}$, but higher or lower doping concentrations may also be used. Laterally outboard of body regions 51 are source regions 38. The body region may have doping concentration usefully in the range of $1.10^{18}$ cm$^{-3}$ to $1.10^{20}$ cm$^{-3}$, conveniently in the range of $2.10^{18}$ cm$^{-3}$ to $7.10^{19}$ cm$^{-3}$, and more conveniently in the range of $5.10^{18}$ cm$^{-3}$ to $5.10^{19}$ cm$^{-3}$, but higher or lower doping concentrations may also be used. The buried channel shielding layer may have a doping concentration in the range of $1.10^{17}$ cm$^{-3}$ to $2.10^{18}$ cm$^{-3}$. The contact region may have a doping concentration in the range of $1.10^{17}$ cm$^{-3}$ to $2.10^{18}$ cm$^{-3}$.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a semiconductor body comprising a first conductivity type, a first major surface and a second major surface opposite the first major surface;
    a planar gate arranged on the first major surface;
    a body region comprising a second conductivity type, the second conductivity type opposite the first conductivity type, the body region extending into the semiconductor body from the first major surface;
    a source region comprising the first conductivity type and arranged in the body region;
    a buried channel shielding region comprising the second conductivity type;
    a contact region comprising the second conductivity type and coupling the buried channel shielding region with the source region, wherein the contact region is more highly doped than the buried channel shielding region and the buried channel shielding region is more highly doped than the body region;
    a field plate arranged in a trench extending into the semiconductor body from the first major surface; and
    a drain region doped with the first conductivity type arranged below the field plate.

2. The semiconductor device of claim 1, wherein the body region extends laterally from the trench and has a distal end positioned under the planar gate, wherein the buried channel shielding region extends laterally from the trench and is positioned under at least a portion of the body region, and wherein the contact region extends into the buried channel shielding region.

3. The semiconductor device of claim 1, wherein the semiconductor substrate further comprises an enhancement region extending from the first major surface to the buried channel shielding region, and wherein the enhancement region comprises the first conductivity type and is more highly doped than the semiconductor body.

4. The semiconductor device of claim 1, wherein the source region, the body region, the contact region and the buried channel shielding region are arranged on two opposite edges of the planar gate and provide two channels that are symmetric with respect to the planar gate.

5. The semiconductor device of claim 1, wherein the source region, the body region, the contact region and the buried channel shielding region are arranged adjacent a single edge of the planar gate.

6. The semiconductor device of claim 5, wherein the trench is columnar, wherein the semiconductor device further comprises a further columnar trench comprising a further field plate, and wherein side walls of the further trench are formed by portions of the semiconductor substrate comprising the first conductivity type.

7. The semiconductor device of claim 6, wherein the planar gate comprises a ring arranged on the first major surface concentrically with the field plate.

8. The semiconductor device of claim 5, wherein the field plate is coupled to the source region, the body region, the contact region and the buried channel shielding region by a metal contact that is in direct contact with the source region and the contact region, and wherein the metal contact extends laterally asymmetrically from the field plate and leaves part of the trench uncovered.

9. The semiconductor device of claim 6, wherein the further field plate in the further columnar trench is coupled to a metal contact that extends laterally asymmetrically from the further field plate and leaves part of the further columnar trench uncovered.

10. The semiconductor device of claim 6, further comprising a well comprising the first conductivity type arranged in the first major surface, wherein the well is arranged adjacent the second columnar trench.

11. The semiconductor device of claim 6, wherein the gate extends over the further columnar trench.

12. The semiconductor device of claim 1, wherein the buried channel shielding region is arranged within the body region.

13. The semiconductor device of claim 1, further comprising a second buried channel shielding region extending from the buried channel shielding region towards the second major surface of the semiconductor substrate, the second buried channel shielding region being more lightly doped than the buried channel shielding region.

14. A method for fabricating a semiconductor device, the method comprising:
  forming a planar gate on a first major surface of a semiconductor body, the semiconductor body further comprising a first conductivity type and a second major surface opposite the first major surface;
  forming a body region comprising a second conductivity type in the semiconductor body, the second conductivity type opposite the first conductivity type, the body region extending into the semiconductor body from the first major surface;
  forming a source region comprising the first conductivity type in the body region;
  forming a buried channel shielding region comprising the second conductivity type in the semiconductor body;
  forming a contact region comprising the second conductivity type that couples the buried channel shielding region to the source region, wherein the contact region is more highly doped than the buried channel shielding region and the buried channel shielding region is more highly doped than the body region;
  forming a trench extending into the semiconductor body from the first major surface;
  forming a field plate in the trench; and
  forming a drain region doped with the first conductivity type under the trench.

15. The method of claim 14, wherein the buried channel shielding region is formed in the entire lateral extent of the semiconductor body, and wherein the method further comprises:
  forming a drift connection region comprising the first conductivity type in a side wall of the trench, the drift connection region extending to the first major surface of the semiconductor body to provide a path comprising the first conductivity type from the first major surface to the second major surface of the semiconductor body.

16. The method of claim 15, wherein the drift connection region extends onto the first major surface.

* * * * *